United States Patent [19]

Alapat

[11] Patent Number: 5,497,475
[45] Date of Patent: Mar. 5, 1996

[54] CONFIGURABLE INTEGRATED CIRCUIT HAVING TRUE AND SHADOW EPROM REGISTERS

[75] Inventor: Varkey P. Alapat, Sunnyvale, Calif.

[73] Assignee: National Semiconductor Corporation, Santa Clara, Calif.

[21] Appl. No.: 14,311

[22] Filed: Feb. 5, 1993

[51] Int. Cl.[6] ................................................. G06F 13/10
[52] U.S. Cl. ................................ 395/430; 364/DIG. 1; 364/244.9; 326/38; 371/22.2
[58] Field of Search .......................... 364/200 MS Files, 364/900 MS Files; 395/400, 425, 430, 750; 365/185, 156, 154, 185, 226, 900; 326/37, 38, 39; 371/22.2

[56] References Cited

U.S. PATENT DOCUMENTS

| | | | |
|---|---|---|---|
| 4,519,090 | 5/1985 | Stackhouse et al. | 377/29 |
| 4,930,098 | 5/1990 | Allen | 364/716 |
| 5,007,026 | 4/1991 | Gaultier et al. | 365/201 |
| 5,038,327 | 8/1991 | Akaogi | 365/230.06 |
| 5,111,423 | 5/1992 | Kopec, Jr. et al. | 395/500 |
| 5,181,205 | 1/1993 | Kertis | 371/21.1 |
| 5,187,392 | 2/1993 | Allen | 307/465 |
| 5,198,997 | 3/1993 | Arakawa | 365/185 |
| 5,243,573 | 9/1993 | Makihara et al. | 365/205 |
| 5,319,594 | 7/1994 | Uemura et al. | 365/185 |

FOREIGN PATENT DOCUMENTS

| | | |
|---|---|---|
| 0272848 | 6/1988 | European Pat. Off. |
| 0334763 | 9/1989 | European Pat. Off. |
| 0332135A2 | 9/1989 | European Pat. Off. |
| 0337393 | 10/1989 | European Pat. Off. |
| 0335008 | 10/1989 | European Pat. Off. |
| 0459246 | 12/1991 | European Pat. Off. |

OTHER PUBLICATIONS

"A Macro Analysis of Soft Errors in Static RAM's"; Yasunobu Nakase et al.; IEEE Journal of Solid–State Circuits, vol. 23, No. 2, Apr. 1988; pp. 604–605.

*Primary Examiner*—Eddie P. Chan
*Assistant Examiner*—Hiep T. Nguyen
*Attorney, Agent, or Firm*—Flehr, Hohbach, Test, Albritton & Herbert

[57] ABSTRACT

A configurable integrated circuit includes a first register having N EPROM cells, and a second register having N EPROM cells, each EPROM cell in the second register corresponding to a distinct one of the N EPROM cells in the first register. Register programming circuits store a set of N binary configuration values in the first register and store boolean complements of the N binary configuration values in the second register. N configuration value sensing circuits are used to read the EPROM cells and generate N configuration signals. Each configuration value sensing circuit is a set/reset latch coupled to one EPROM cell in the first register and the corresponding EPROM cell in the second register. Under normal operating conditions, the latch generates a configuration signal corresponding to the configuration value stored in the one EPROM cell in the first register. A strengthening circuit protects the sensing circuit from alpha particle radiation by applying a strengthening current to each latch after the latch has already reached a stable state. The configurable integrated circuit has a multiplicity of configurable circuits, each configurable circuit having at least one transistor that receives at least one of the N configuration signals and configures the configurable circuit in accordance therewith.

17 Claims, 2 Drawing Sheets

CONFIGURABLE INTEGRATED CIRCUIT HAVING TRUE AND SHADOW EPROM REGISTERS

The present invention relates to EPROM circuits used to customize data processing circuits as well as other types of integrated circuits.

BACKGROUND OF THE INVENTION

For the purposes of low-cost, mass production of certain circuits, such as low end microprocessors (also called microcontrollers) used in many toys and consumer products, it is sometimes more cost efficient to have a single standard circuit, than to have numerous different versions of the circuit. To make this possible, the standard circuit can be provided with a number of EPROM (electrically programmable read only memory) cells or EEPROM (electrically erasable and programmable read only memory) cells that are programmed after the circuit is manufactured to "configure" the circuit for a particular use. For instance, the bit values stored in the EPROM cells might determine the type of clock signal used by the circuit by connecting one of several subcircuits to an internal clock node. A second major use of microcontrollers with embedded EPROM cells is for emulation of other circuits (such as other families of integrated circuits) and for software development.

Of course, the use of EPROM and other non-volatile memory cells in microprocessors and microcontrollers is not, by itself, new. The present invention address the need for configuration circuits that: (a) are area-efficient to target market segments which are under tough price competition, (b) have low power consumption in order to enable battery operation, (c) have the ability to operate under a wide range of power supply voltages, such as a range of 6 volts to 2.5 volts, (d) have built-in testability features, (e) are capable of asynchronous operation, and (f) have alpha particle protection features. In the prior art, it has been difficult to meet all these criteria.

Even though the conventional sense amplifiers used in EPROM memory devices can be used to read the state of the EPROM configuration cells, such sense amplifiers are not cost effective in terms of the silicon chip area used. The reason for this is that conventional EPROM sense amplifiers in EPROM memory devices need to operate at very high speeds, and thus speed of operation is more important in such devices than area efficiency. For configuration circuits, speed of operation is not important. This is because in low-end microcontrollers, these registers typically need to be evaluated only when the chip is reset.

Under normal operating conditions, the configuration circuit should not have static power consumption. This is an important criteria for extending battery life.

The configuration registers should be capable of asynchronous operation, since there may not be a clock available during certain modes of operation, such as in programming mode, since the configuration register may need to be programmed first for configuring the appropriate clock circuitry.

Since the configuration registers may be used in a one-time programmable device, it is important to be able to test that the configuration cells are unprogrammed and that the sensing circuitry is operational at least for the default configuration register values.

The desirability for having alpha particle protection circuitry arises from the fact that configuration registers typically need to be evaluated only when the chip is reset. The present invention provides a latch strengthening feature to protect the latch in which sensed configuration values are stored from alpha particles that might otherwise change its state. Furthermore, the latch strengthening is provided in a space efficient manner.

A major market for one-time-programmable (OTP) parts are so-called "two battery" applications. That is, many OTP parts are used in toys and instruments that are powered by two serially arranged batteries. Typically, the battery operated instrument initially receives a power supply voltage of about 3 volts when the batteries are new. However, the voltage provided by the battery degrades with use. Many industrial microcontrollers are rated for operation at low supply voltages such as 2.5 volts. Industry standard specifications could require that these same parts also be operable at a power supply voltage of 6.0 volts.

It is difficult to make configuration registers which can operate over a wide range of supply voltages, such as 6 volts to 2.5 volts, while still satisfying low power consumption requirements and silicon area constraints. However, to sell configurable microcontrollers to different market segments, these voltage range, power consumption and silicon area criteria are very important. The main mason it is difficult to make configuration registers which can operate over a wide range of supply voltages is that the optimal resistance of the sense-amplifier devices for reading the EPROM cells is very different for 6.0 volt and 2.5 volt operation. In particular, at low voltages, if an unprogrammed EPROM cell is only partially turned on it draws very little current, making it hard to distinguish from a programmed cell. At high voltages, programmed EPROM cells are known to leak, which tend to make them look like unprogrammed cells.

SUMMARY OF THE INVENTION

The primary object of the present invention is to provide a configuration register that can be reliably read at both high and low supply voltages, over a full range of process and temperature variations, while also having low power consumption to enable battery operation. It is also an object of the present invention to provide a configuration register that has built-in testability features, that occupies very little circuit layout area, that is capable of asynchronous operation and has built-in alpha particle protection.

In summary, the present invention is a configurable integrated circuit having first and second EPROM registers, sometimes herein called the True and Shadow registers. The first register has a first set of N EPROM cells, and the second register has a second set of N EPROM cells, each EPROM cell in the second register corresponding to a distinct one of the N EPROM cells in the first register.

Register programming circuits store a set of N binary configuration values in the first register and store boolean complements of the N binary configuration values in the second register. N configuration value sensing circuits are used to read the EPROM cells and generate N configuration signals. Each configuration value sensing circuit is a set/reset latch coupled to one EPROM cell in the first register and the corresponding EPROM cell in the second register. Under normal operation when the first and second registers are appropriately programmed, the latch generates a configuration signal corresponding to the binary configuration value stored in the one EPROM cell in the first register. A strengthening circuit protects the sensing circuit from alpha particle radiation. The configurable integrated circuit has a multiplicity of configurable circuits, each configurable circuit having at least one transistor that receives one of the N configuration signals and configures the configurable circuit in accordance therewith.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
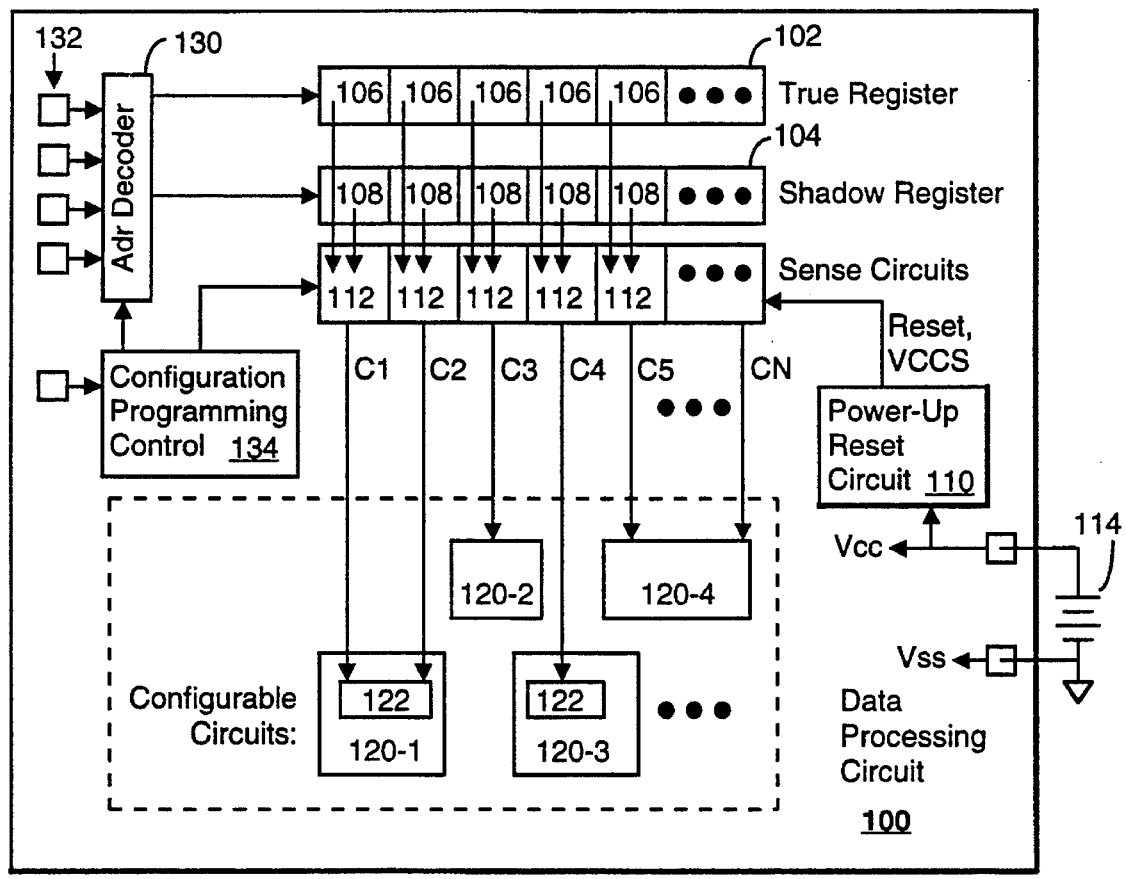
FIG. 1 is a block diagram of a data processing circuit having a configuration register, configuration sense circuits, and a set of configurable circuits.

Referring to FIG. 1, a data processing circuit 100 utilizes two separate EPROM registers, True Register 102, and Shadow Register 104. Each register 102, 104 contains N EPROM cells 106, 108, where N is typically a positive integer such as eight, sixteen or other multiple of the device's word size. Thus, in most applications, each register 102, 104 will have at least a multiplicity of EPROM cells.

For each EPROM cell 106 in the True Register 102, there is a corresponding cell 108 in the Shadow Register 104. Furthermore, under normal operating conditions, each cell 108 in the Shadow register is programmed to store the boolean complement of the value stored in the corresponding cell 106 of the True Register.

For the purposes of this explanation, we will assume that cell 106 in the True Register 102 is programmed to store a "0" value (i.e., the EPROM cell is programmed), and that the corresponding Shadow Register cell 108 stores a "1" value (i.e., the EPROM cell 108 is unprogrammed). The circuitry for programming the EPROM cells is discussed below. However, the primary concern of this patent is the circuitry for reading the EPROM cells in registers 102 and 104.

For those not conversant with EPROM cells, it is important to know that when an EPROM cell is programmed, electrons are stored on the cell's floating gate, and the cell is considered to be "off" because it does not conduct current even when a positive voltage (but less than its programmed threshold voltage, such as five volts) is applied to its control gate. When an EPROM cell is unprogrammed, it is considered to be "on" because it does conduct current when a positive voltage (over its unprogrammed threshold voltage) is applied to its control gate. As will be understood by those skilled in the art, the assignment of "1" and "0" binary values to unprogrammed and programmed EPROM cells, respectively, is totally arbitrary and could be reversed simply by adding another inverter to the outputs of the sense amplifiers 112.

Each time that the data processing circuit 100 is reset, as detected by reset circuit 110, a set of sense amplifiers 112 read the EPROM cells in the True and Shadow Registers and generate a set of N configuration signals C1 to CN. The sense amplifiers 112 are herein called "pseudolatches" because each amplifier 112 acts as a latch that holds its value until the next time the data processing circuit 100 is reset.

The data processing circuit 100 is powered by an external voltage supply 114, for example, a pair of serially connected 1.5 volt dry cell batteries. As long as the data processing circuit is powered, the voltage at the output of the sense amplifiers remains at supply voltage or ground (depending on the register values), mimicking a latch.

The data processing circuit 100 typically includes a multiplicity of configurable circuits 120-1, to 120-4, each of which receives at least one of the configuration signals C1 to CN. It is possible for a single configuration signal Cx to be used by several of the configurable circuits 120-x. Furthermore, each configurable circuit 120-x will include at least one circuit device 122, typically a transistor gate or set of logic gates, that receives at least one of the configuration signals and configures the configurable circuit in accordance therewith. For instance, configurable circuit 120-1 might select one of three clock signal sources as the main clock for the circuit 100 based on the values of configuration signals C1 and C2.

The circuitry for programming the cells 106, 108 in the registers 102, 104 includes an address decoder 130 that decodes address signals received from several pins 132, and a configuration programming control circuit 134 that generates the various signals, described below, needed to program specified ones of the cells 106, 108.

In the preferred embodiment the address decoder 130 provides separate addresses for the cells in the True Register 102 and Shadow Register 104, enabling the cells in each Register to be separately programmed. By making the True and Shadow registers separately programmable, the circuitry of the sense circuits can be kept small and relatively simple. Programming software (used in the programmers that store data in the configuration registers) can be written to ensure that complementary values are programmed into the True and Shadow registers.

Figure 2:
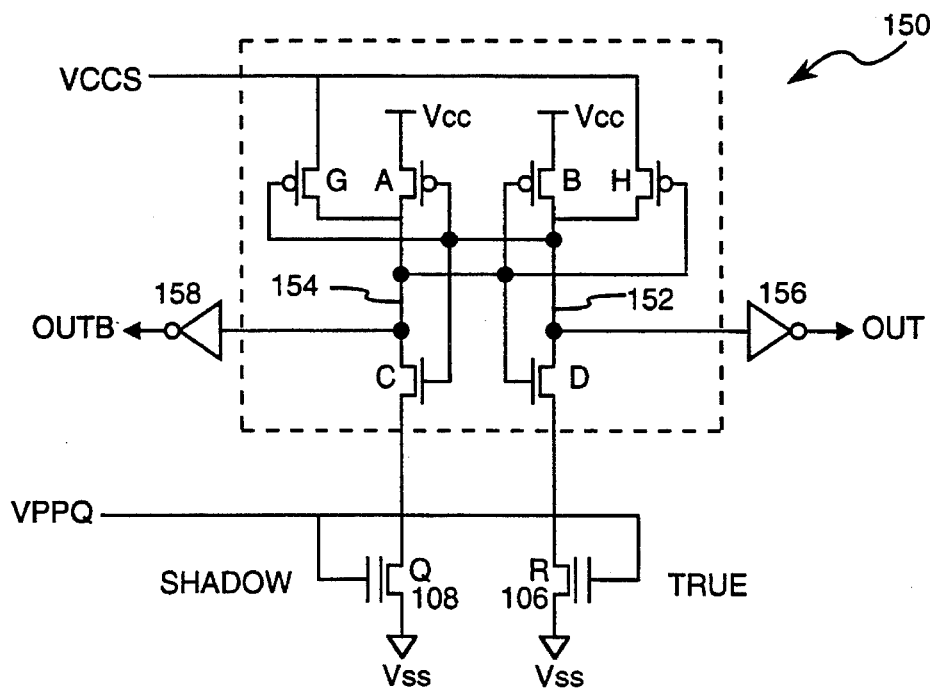
FIG. 2 is a circuit diagram of a complementary pair of EPROM cells and a simplified latching sense amplifier.
Figure 3:
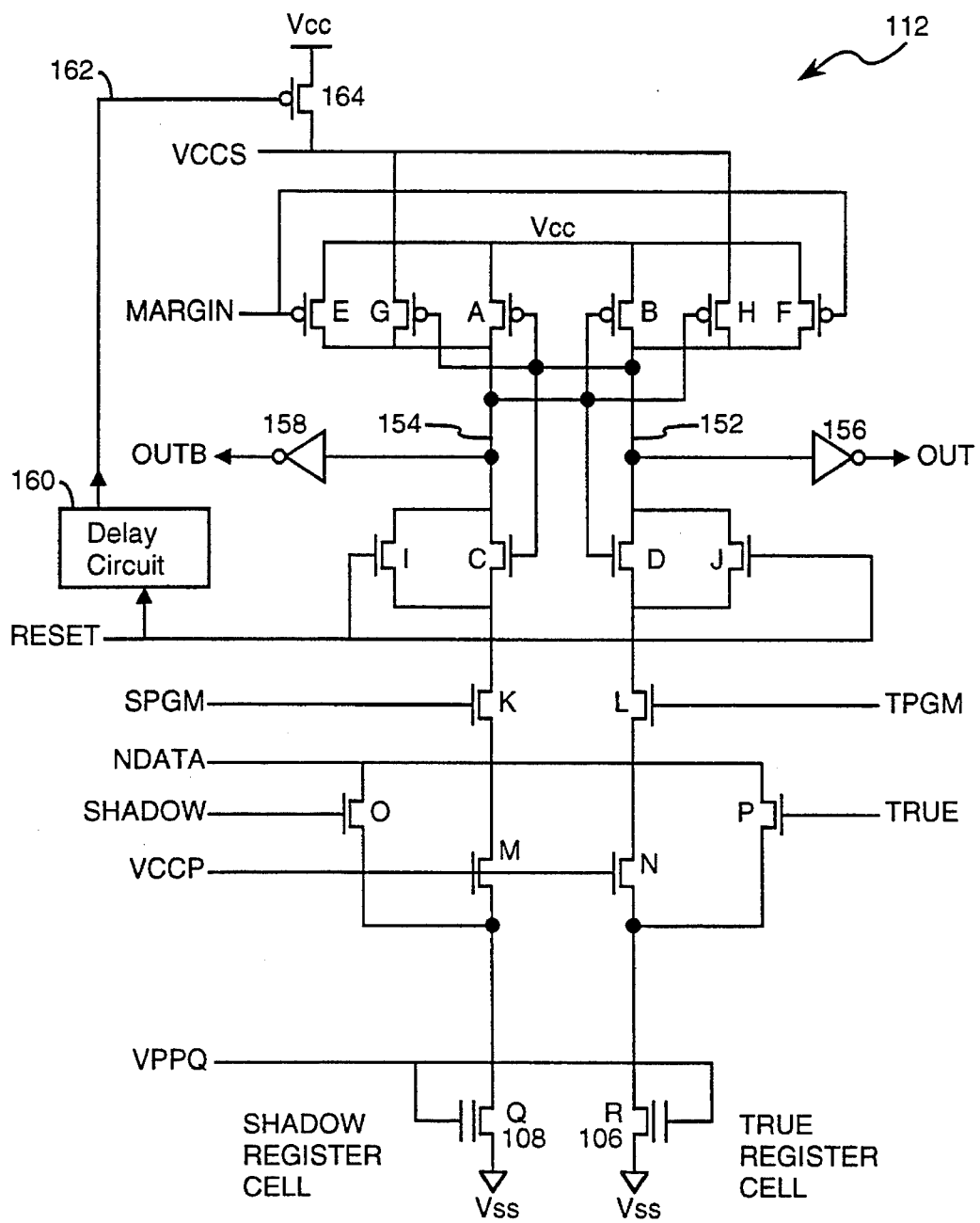
FIG. 3 is a circuit diagram of a complementary pair of EPROM cells and a pseudolatch in accordance with the present invention.

FIG. 2 shows a simplified sense amplifier (latch) circuit 150 representing a portion of the full pseudolatch circuit 112 which is shown in FIG. 3. Transistors A and B are P-long-channel transistors that function as pull up resistors for nodes 152 and 154. Transistors C and D are N-channel transistors that cross-coupled with p-channel transistors A and B to form a latch. The source diffusions of the C and D transistors form the set and reset ports of the latch, where the latch is set or reset by active low signals on the set or reset ports, respectively. Transistors R (106) and Q (108) each comprise one cell of the True and Shadow registers, respectively, and these two cells are electrically coupled to the reset and set ports of the latch, respectively.

To follow the normal operation of the sense amplifier (latch) circuit 150, assume that Vcc is equal to 5 volts, Vss is equal to 0 volts, transistor R is programmed, and is therefore "off" (assigned a binary value of "0"), and that transistor Q is unprogrammed, and is therefore "on" when the Vcc voltage is applied on the VPPQ line. Also, assume that nodes 152 and 154 are initially at voltages somewhere between Vcc and Vss and that transistors C and D are both shorted with conducting transistors for the purposes of initialization.

During normal operation, the VPPQ signal (which is applied to the control gates of the EPROM cells) is brought up to the Vcc voltage (typically 5 volts) shortly after power up of the data processing circuit. As a result, transistor Q will be in the conducting state, thereby electrically connecting node 154 to the circuit ground. However, transistor R (which is programmed) will not connect node 152 to the circuit ground. As a result, the voltage on node 154 will be pulled low by cell Q. The falling voltage on node 154 will turn on transistors B and H while turning off transistor D, thereby pulling node 152 up to Vcc. The high voltage on node 152 turns off transistors A and G, and turns transistor C on, ensuring that node 154 remains at a low voltage. Thus the latch 150 will quickly reach a state in which node 152 is at a high voltage and node 154 is at a low voltage. Inverters 156 and 158 generate complementary output signals OUT and OUTB, ("0" and "1", respectively, in this example) and also isolate the internal nodes of the latch 150 from signals elsewhere in the data processing circuit. The OUT signal generated by circuit 150 reflects the value that is stored in the True register cell R (106), and (during normal operation) the OUTB signal is the boolean complement (inverse) of the OUT signal value.

The VPPQ signal is kept at Vcc at all times, except during programming of the EPROM cells when VPPQ is boosted to a special programming voltage level (e.g., 12 volts).

Of course, if R cell 106 were unprogrammed (storing a value of "1") and Q cell 108 were programmed (storing a value of "0"), then the roles of nodes 152 and 154 as described above would be reversed, and the OUT signal would be high, reflecting a value of "1".

Referring to FIG. 3, all the components of circuit 150 from FIG. 2 are also included in pseudolatch circuit 112 and have the same labels as used above. The following is a description of the aspects of the pseudolatch circuit 112 not discussed above with respect to FIG. 2.

N-Channel transistors M and N limit the drain voltage applied to the EPROM cells 106, 108, and are kept on at all times by the VCCP signal. Limiting the drain voltage of the EPROM cells 106, 108 helps to prevent them from being inadvertently programmed during normal circuit operation and enables use of short channel-length EPROM cells. The P-channel E and F transistors are used only for "margin" testing of programmed cells, as will be described below.

N-Channel transistors I and J are used to initialize the latch 112. These transistors are "on" only during chip reset and in test mode. The RESET signal is kept on for sufficiently long after power up to ensure that the state of the Q and R EPROM cells is communicated to nodes 152 and 154. In other words, regardless of the voltages on nodes 152 and 154 at power up, one of these two nodes will be pulled low by the unprogrammed one of the Q and R EPROM cells (assuming that one of the cells has been programmed), which in turn will cause the other of these two nodes to become charged by transistor A or B. Once the RESET signal is disabled, transistors I and J are turned off and transistors C and D control the voltages on nodes 152 and 154 and the OUT and OUTB signals are generated in accordance with those voltages.

Note that since transistors K, L, M and N are permanently on during normal operation, the EPROM cells are electrically connected to the set and reset nodes of the latch at the source diffusions of the C and D transistors. N-channel transistors K and L are disabled (by disabling the SPGM and TPGM signals only when the EPROM cells 106, 108 are being programmed or margin tested.

The VCCS signal transitions from floating (i.e., high impedance state) to Vcc a short delay period (e.g., a few milliseconds, or even a few seconds) after the circuit 150 reads the values of the complementary Q and R cells 108 and 106. Transistors G and H are P-channel transistors with much greater current drive than transistors A and B. As a result, the one of the OUT and OUTB signals that is high will be greatly strengthened or reinforced, which helps to prevent the value stored on the latch's internal nodes 152, 154 from being accidentally flipped by noise, or by an alpha particle hitting the circuit 150. For this reason, transistors G and H are called "latch strengthening" transistors, and the VCCS node is called the latch strengthening supply.

It should be noted that operation of the pseudolatch circuit is automatic upon power-on reset, and is asynchronous in that it does not require the availability of any clock signals.

Test Mode

The pseudolatch 112 includes a test mode of operation for testing the integrity of the latch even when both the cells 106 and 108 are unprogrammed.

Figure 4:
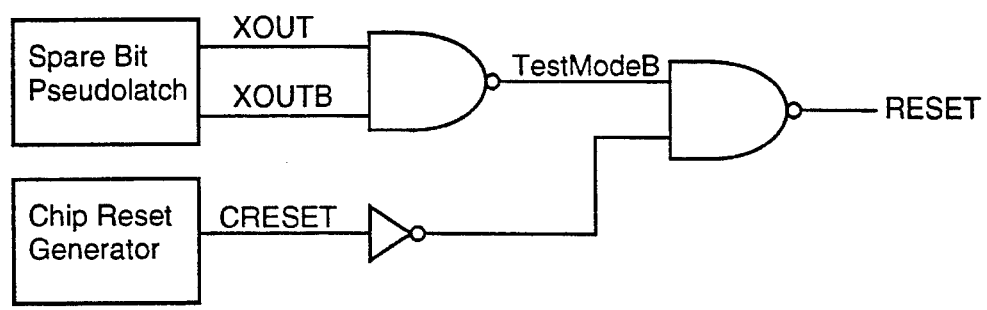
FIG. 4 depicts a logic circuit for generating a reset signal.

Referring to FIGS. 3 and 4, the RESET signal used in the pseudolatches 112 remains active high, even after the chip reset signal CRESET becomes inactive, if both cells of a particular "spare bit" in the configuration register are unprogrammed. The unprogrammed status of both cells of the "spare bit" is indicated by the test mode signal TestModeB being low. The "spare bit" can be any pair of EPROM cells from the True and Shadow registers, and need not be cells specially reserved for controlling the RESET signal. That is, the logic circuit shown in FIG. 4 causes the RESET signal to remain high when XOUT and XOUTB from the spare bit's pseudolatch are both high, indicating that both cells are unprogrammed. This feature of the invention assists in testing the configuration registers while all configuration cells remain unprogrammed, because it keeps transistors I and J turned on, which disables the normal cross-coupled latching action of circuit 112.

Latch Strengthening

After the 1-0 state of the pseudolatch is determined, latch strengthening is used to protect the latch from having its state change by alpha particles using on-chip logic. A built-in delay circuit 160 is triggered after the latch initialization RESET signal goes low, at which time the delay circuit 160 outputs a low signal on line 162 after a delay of several milliseconds to enable P-channel transistor 164, thereby pulling the latch strengthening VCCS node up to Vcc. In some implementations the integrated circuit will already have a number of clock signals derived from the chip's main clock, and one of those clock signals would be used to generate the VCCS enabling signal on line 162 after the RESET signal is disabled. Note that the VCCS node is not turned on during the chip's reset period because the resulting current from transistors G and H might cause the latch 112 to settle into the wrong state.

In summary, the additional transistors G and H support the latch action of the A and B transistors after initialization of the latch is over, providing a latch strengthening voltage supply. Moreover, wide P-channel transistors G and H give stronger drive to the node of the latch which is at logic 1 (either node 152 or 154 depending on the state of the latch). For additional background information on soft errors caused by alpha particles, see Nakase et al., "A Macro Analysis of Soft Errors in Static RAM's", IEEE J. Solid State Cir., vol. 23, no. 2, pp. 604–605 (April 1988).

Programming the Configuration Registers

Programming the cells in the True and Shadow registers is accomplished as follows. Before any programming is performed, all the cells are unprogrammed by exposing them to ultraviolet light. A selected EPROM cell is programmed by applying a high voltage (typically 11 to 24 volts, depending on the process used to fabricate the EPROM cell) to the EPROM cell's control gate, while also applying a high voltage (typically 11 to 24 volts) to the EPROM cell's drain. Note that the EPROM's source is connected to a low voltage potential (ground). Hot electrons are generated in the cell's channel, some of which become stored on the cell's floating gate, thereby increasing the control gate threshold voltage.

In the present circuit, before programming either of the cells 106 or 108, the SPGM and TPGM signals are disabled, thereby turning N-channel transistors K and L off and isolating the programming circuitry from the latching circuitry. Next the VPPQ line is coupled to a high programming voltage, so that a programming voltage is applied to the EPROM cell control gates. Then, if the True cell 106 is to be programmed, a high programming voltage is applied to NDATA and to the TRUE line, turning on transistor P and asserting the high programming voltage on the drain of the true cell 106. The high programming voltage is typically applied for only a short period of time, after which the cell 106 is "margin" tested by applying a "margin test Vcc voltage" (e.g., six volts) to the EPROM cells, turning on transistors E and F (by pulling the MARGIN signal to a low voltage), and turning on transistor L (by enabling TPGM) while leaving transistor K off. Note that these signal settings will cause transistors B and H to be off during margin testing of the true cell 106. Then the voltage on line 152 is tested. After several such programming cycles, the True cell 106 will be sufficiently programmed that node 152 will remain high during the margin test, indicating that programming of the cell 106 is complete.

Note that only one cell Q or R of each complementary pair is programmed, and the other cell is left unprogrammed. When the Shadow cell 108 is the one to be programmed, all of the above programming steps remain the same, except that the SHADOW signal is enabled so that the programming voltage is applied to the drain of the Q cell 108, and margin testing of the Q cell 108 is performed by enabling transistor K instead of transistor L. Furthermore, during programming of the EPROM cells of a data processing circuit 100, the TRUE and SHADOW signals in the various pseudolatch circuits 112 are selected by the address decoder 130 shown in FIG. 1.

In some circumstances, the programming procedure will call for a "0" or "1" value to be explicitly written into each and every EPROM cell in a circuit 100. The above described programming procedure wrote a "0" into any selected EPROM cell. The procedure for "writing" a "1" into an EPROM cell 106 or 108 is to apply a zero voltage to the NDATA line while addressing the cell. Since no current will flow through the selected EPROM cell under these conditions, the cell remains unprogrammed and thus retains a value of "1".

Operation with Wide Range of Power Supply Voltages

By providing a pair of complementary EPROM bits for each configuration bit, the present invention ensures that the pseudolatch is set one way of the other. Even when there is a partially conducting EPROM cell due to incorrect threshold values, insufficient programming, or incorrect power supply, the latch will set correctly. For example, at high power supply voltages, when a programmed EPROM cell, say R, tends to leak, the unprogrammed complementary cell (Q) conducts very well since the voltage on its gate is well above the threshold of the unprogrammed cell. This results in a low voltage appearing on node 154, turning off transistor D, and the power supply voltage appearing on node 152. Thus the latch 112 sets fully in the proper state despite a leaking cell at high power supply voltage.

At low power supply voltage, when an unprogrammed cell, say Q, is not fully on, the programmed cell (R) is turned fully off since its threshold voltage will be much higher than the supply voltage. This results in node 152 receiving the full supply voltage, which turns off P-channel transistor A, and thus node 154 is pulled to the circuit ground potential.

The configuration register (i.e., the True and Shadow registers 102, 104 and the pseudolatches 112) of the present invention use much less silicon area than the configuration registers of the prior art, even though twice as many EPROM cells are used, because very little control circuitry is needed for the pseudolatches 112. The provision of pairs of EPROM cells storing complementary values makes detection of the stored configuration values possible over a wide range of supply voltages, and eliminates many of the problems associated with prior art configuration register circuits. Furthermore, because the pseudolatch 112 will operate correctly with a supply voltage (Vcc) that is only a little above the threshold voltage of an unprogrammed EPROM cell (e.g., 2.5 V), the present invention provides a data processing circuit which may be reliably read using a power supply of just two dry cell batteries having a total supply voltage below 3 volts over a full range of process and temperature variations.

While the present invention has been described with reference to a specific embodiment, the description is illustrative of the invention and is not to be construed as limiting the invention. Various modifications may occur to those skilled in the art without departing from the true spirit and scope of the invention as defined by the appended claims. In particular, it is important to note that the complementary configuration registers of present invention could be implemented using EEPROM cells, or other types of non-volatile memory cells. Further, since the pseudolatches using the complementary configuration registers of present invention are very energy and space efficient, the present invention could be profitably used in non-OTP parts (i.e., with configuration registers that can be reprogrammed multiple times).

What is claimed is:

1. A configurable integrated circuit, comprising:

a first set of N EPROM cells, where N is a positive integer greater than one, said first set of N EPROM cells for storing N binary configuration values, each of said N binary configuration values having a boolean complement value associated therewith;

a second set of N EPROM cells for storing the boolean complements associated with said N binary configuration values;

N configuration value sensing circuits, each configuration value sensing circuit coupled to one EPROM cell in said first set of N EPROM cells and a corresponding one EPROM cell from said second set of N EPROM cells, each configuration value sensing circuit outputting a configuration signal corresponding to the binary configuration value stored in said one EPROM cell in said first set of N EPROM cells;

a multiplicity of configurable circuits, each configurable circuit having at least one circuit device that receives one of said configuration signals wherein each of said configurable circuits are configured for operation in accordance with said one of said configuration signals received thereby; and power connections for coupling said integrated circuit to a supply voltage;

wherein said first and second sets of N EPROM cells together enable said N configuration value sensing circuits to accurately sense said N binary configuration values when said supply voltage is as low as 2.5 volts.

2. A configurable integrated circuit as in claim 1, each of said N configuration value sensing circuits including a latch having two internal nodes, one of which develops a low voltage and the other of which develops a higher voltage in accordance with the binary configuration value stored in said one EPROM cell in said first set of N EPROM cells;

said latch further including strengthening means for providing additional current to the one of said internal nodes which develops said higher voltage and delay circuitry for enabling said strengthening means only after said two internal nodes of said latch have already developed opposite voltage levels, said strengthening means thereby protecting said latch from having its state changed by alpha particle radiation.

3. A configurable integrated circuit as in claim 1, each of said N configuration value sensing circuits including a latch that has two P-channel transistors cross-coupled with two N-channel transistors, said two N-channel transistors including respective source diffusions that are each electrically coupled to a corresponding one of said EPROM cells in a respective one of said first and second sets of N EPROM cells, wherein said respective source diffusions of said two N-channel transistors function as set and reset terminals of said latch.

4. A configurable integrated circuit as in claim 1, each of said N configuration value sensing circuits including test circuitry for testing integrity thereof when both of said EPROM cells coupled thereto are unprogrammed;

wherein said test circuitry is enabled only when a predetermined one EPROM cell in said first set of N EPROM cells and a corresponding predetermined one EPROM cell from said second set of N EPROM cells are in respective predefined storage states.

5. A configurable integrated circuit as in claim 1, further comprising:

programming circuits for storing a set of N binary configuration values in said first set of N EPROM cells wherein each of said N binary configuration values has a boolean complement value associated therewith, and for storing said boolean complement values associated with said N binary configuration values in said second set of N EPROM cells.

6. A configurable integrated circuit as in claim 5, said programming circuits including means for addressing and programming cells in said first set of N EPROM cells separately from addressing and programming cells in said second set of N EPROM cells.

7. A configurable integrated circuit, comprising:

a first set of N nonvolatile memory cells, where N is a positive integer greater than one, said first set of N nonvolatile memory cells for storing N binary configuration values;

a second set of N nonvolatile memory cells for storing the boolean complements of said N binary configuration values;

N configuration value sensing circuits, each configuration value sensing circuit coupled to one nonvolatile memory cell in said first set of N nonvolatile memory cells and a corresponding one nonvolatile memory cell from said second set of N nonvolatile memory cells, each configuration value sensing circuit outputting a configuration signal corresponding to the binary configuration value stored in said one nonvolatile memory cell in said first set of N nonvolatile memory cells;

a multiplicity of configurable circuits, each configurable circuit having at least one circuit device that receives one of said configuration signals wherein each of said configurable circuits are configured in accordance with said one of said configuration signals received thereby; and power connections for coupling said integrated circuit to a supply voltage:

wherein said first and second sets of N nonvolatile memory cells together enable said N configuration value sensing circuits to accurately sense said N binary configuration values when said supply voltage is as low as 2.5 volts.

8. A configurable integrated circuit as in claim 7, each of said N configuration value sensing circuits including a latch having two internal nodes, one of which develops a low voltage and the other of which develops a higher voltage in accordance with the binary configuration value stored in said corresponding one nonvolatile memory cell in said first set of N nonvolatile memory cells;

said latch further including strengthening means for providing additional current to the one of said internal nodes which develops said higher voltage and delay circuitry for enabling said strengthening means only after said two internal nodes of said latch have already developed opposite voltage levels, said strengthening means thereby protecting said latch from having its state changed by alpha particle radiation.

9. A configurable integrated circuit as in claim 7, each of said N configuration value sensing circuits including a latch that has two P-channel transistors cross-coupled with two N-channel transistors, said two N-channel transistors including respective source diffusions that are each electrically coupled to a corresponding one of said nonvolatile memory cells in a respective one of said first and second sets of N nonvolatile memory cells, wherein said respective source diffusions of said two N-channel transistors function as set and reset terminals of said latch.

10. A configurable integrated circuit as in claim 7, each of said N configuration value sensing circuits including test circuitry for testing integrity thereof when both of said nonvolatile memory cells coupled thereto are unprogrammed;

wherein said test circuitry is enabled only when a predetermined one nonvolatile memory cell in said first set of N nonvolatile memory cells and a corresponding predetermined one nonvolatile memory cell from said second set of N nonvolatile memory cells are in respective predefined storage states.

11. A configurable integrated circuit as in claim 7, further comprising:

programming circuits for storing a set of N binary configuration values in said first set of N nonvolatile memory cells wherein each of said N binary configuration values has a boolean complement value associated therewith, and for storing said boolean complement values associated with said N binary configuration values in said second set of N nonvolatile memory cells.

12. A configurable integrated circuit as in claim 11, said programming circuits including means for addressing and programming cells in said first set of N nonvolatile memory cells separately from addressing and programming cells in said second set of N nonvolatile memory cells.

13. A configurable integrated circuit, comprising:

a first set of N nonvolatile memory cells, where N is a positive integer greater than one, said first set of N nonvolatile memory cells for storing N binary configuration values;

a second set of N nonvolatile memory cells for storing the boolean complements of said N binary configuration values;

N configuration value sensing circuits, each configuration value sensing circuit coupled to one nonvolatile memory cell in said first set of N nonvolatile memory cells and a corresponding one nonvolatile memory cell from said second set of N nonvolatile memory cells, each configuration value sensing circuit outputting a configuration signal corresponding to the binary configuration value stored in said one nonvolatile memory cell in said first set of N nonvolatile memory cells;

each of said N configuration value sensing circuits including a latch having two internal nodes, one of which develops a low voltage and the other of which develops a higher voltage in accordance with the binary configuration value stored in said one nonvolatile memory cell in said first set of N nonvolatile memory cells;

said latch further including strengthening means for providing additional current to the one of said internal nodes which develops said higher voltage and delay circuitry for enabling said strengthening means only after said two internal nodes of said latch have already developed opposite voltage levels, said strengthening means thereby protecting said latch from having its state changed by alpha particle radiation; and a multiplicity of configurable circuits, each configurable circuit having at least one circuit device that receives one of said configuration signals wherein each of said configurable circuits are configured in accordance with said one of said configuration signals received thereby.

14. A configurable integrated circuit as in claim 13 wherein said first and second sets of nonvolatile memory cells are of the EPROM type.

15. A configurable integrated circuit, comprising:

a first set of N nonvolatile memory cells, where N is a positive integer greater than one, said first set of N nonvolatile memory cells for storing N binary configuration values;

a second set of N nonvolatile memory cells for storing the boolean complements of said N binary configuration values;

N configuration value sensing circuits, each configuration value sensing circuit coupled to one nonvolatile memory cell in said first set of N nonvolatile memory cells and a corresponding one nonvolatile memory cell from said second set of N nonvolatile memory cells, leach configuration value sensing circuit outputting a configuration signal corresponding to the binary configuration value stored in said one nonvolatile memory cell in said first set of N nonvolatile memory cells;

each of said N configuration value sensing circuits including test circuitry for testing integrity thereof when both of said nonvolatile memory cells coupled thereto are unprogrammed, wherein said test circuitry is enabled only when a predetermined one nonvolatile memory cell in said first set of N nonvolatile memory cells and a corresponding predetermined one nonvolatile memory cell from said second set of N nonvolatile memory cells are in respective predefined storage states; and a multiplicity of configurable circuits, each configurable circuit having at least one circuit device that receives one of said configuration signals wherein each of said configurable circuits are configured for operation in accordance with said one of said configuration signals received thereby.

16. A configurable integrated circuit as in claim 15 wherein said test circuitry is enabled only when said predetermined one nonvolatile memory cell in said first set of N nonvolatile memory cells and said corresponding predetermined one nonvolatile memory cell from said second set of N nonvolatile memory cells are both unprogrammed.

17. A configurable integrated circuit as in claim 15 wherein said first and second sets of nonvolatile memory cells are of the EPROM type.

* * * * *